United States Patent [19]

Lee

[11] Patent Number: 5,747,376

[45] Date of Patent: May 5, 1998

[54] METHOD FOR FABRICATING ISOLATION LAYER OF SEMICONDUCTOR DEVICE

[75] Inventor: Sang-Don Lee, Cheongju, Rep. of Korea

[73] Assignee: LG Semicon Co., Ltd., Choongcheongbuk-do, Rep. of Korea

[21] Appl. No.: 777,352

[22] Filed: Dec. 27, 1996

[51] Int. Cl.$^6$ .................................................... H01L 21/76
[52] U.S. Cl. .......................... 438/443; 438/439; 438/444; 438/445; 438/452
[58] Field of Search .................................. 437/69, 70, 72, 437/73; 438/439, 443, 444, 445, 452

[56] References Cited

U.S. PATENT DOCUMENTS

| | | | |
|---|---|---|---|
| 5,326,715 | 7/1994 | Jang et al. | 437/69 |
| 5,554,543 | 9/1996 | Yang | 437/69 |
| 5,567,645 | 10/1996 | Ahn et al. | 437/69 |

OTHER PUBLICATIONS

N. Shimizu et al., "A Poly–Buffer Recessed LOCOS Process for 256Mbit DRAM Cells", IEDM 92, pp. 279–282, Dec. 1992.

Primary Examiner—Trung Dang
Attorney, Agent, or Firm—Morgan, Lewis & Bockius LLP

[57] ABSTRACT

A method for fabricating an isolation layer of a semiconductor device defines an active region and an isolation region on a semiconductor substrate. An active pattern is formed on the active region of the semiconductor substrate and the active pattern includes a first insulating layer and a first oxidation stop layer formed on the first insulating layer. A first isolation layer is grown over the substrate corresponding to the isolation region and the first isolation layer is selectively etched by using the first oxidation stop layer as a mask. A sidewall spacer is formed adjacent to the active pattern including a remaining portion of the first isolation layer, and the sidewall spacer includes a second insulating layer and a second oxidation stop layer formed on the second insulating layer. A second isolation layer is grown over the substrate.

20 Claims, 3 Drawing Sheets

5,747,376

METHOD FOR FABRICATING ISOLATION LAYER OF SEMICONDUCTOR DEVICE

BACKGROUND OF THE INVENTION

1. Field of the Invention

The present invention relates to a method for fabricating a semiconductor device, and more particularly, to a method for fabricating an isolation layer of a semiconductor device.

2. Discussion of the Related Art

There are basically two conventional methods for fabricating an isolation layer for a semiconductor device. One uses a LOCOS technology, and the other uses a trench process technology. Recently, a combined LOCOS and trench technology was disclosed by Ho-kyu Kang in *Conf. of Semicon KOREA '95*, p.17 (Jan. 20, 1995). A similar combination was also disclosed by T. Park et. al. in *IEDM Tech. Dig.*, p. 675 (1994). This technology can remarkably reduce the width of an isolation layer.

The trench process technology has several problems. Since a silicon substrate must be etched during a trench process, the etching damages the silicon substrate, thereby causing leakage currents. This, in practice, makes the electrical isolation between transistors difficult. Therefore, although this technology is able to provide a narrow width for the isolation layer, it is difficult to secure a stabilized process to remove the damages caused on the substrate after etching the trench. Accordingly, the trench process technology has not been widely used.

An improved LOCOS isolation technology such as polysilicon-buffer LOCOS (PBL), polysilicon sidewall spacer LOCOS (PSL), nitride-clad LOCOS (NCL), or nitride sidewall spacer LOCOS (NSL) is capable of providing a narrower width of the isolation region than that of the conventional LOCOS technology. However, it is presently impossible to form an isolation region with a width below 0.25 μm to 0.3 μm. In addition, the NCL or NSL process results in poor kink characteristics for a MOS field effect transistor (MOSFET) and deterioration of time dependent dielectric breakdown (TDDB) characteristics of a gate oxide layer.

A conventional method for fabricating an isolation layer of a semiconductor device using an NCL process will now be explained with reference to FIGS. 1A to 1D. As shown in FIG. 1A, a pad oxide 12 is deposited on a silicon substrate 10. A first nitride layer 14 is then formed on one portion of the pad oxide layer 12, which will be an active region. The other portion of the pad oxide layer 12 is defined as an isolation region. Then, the pad oxide layer 12 at the isolation region (including both edge portions under the first nitride layer 14) is etched to a predetermined thickness, in order to reduce the extension of the isolation region.

As shown in FIG. 1B, a second nitride layer 16 is formed on the etched surface of the pad oxide layer 12 and on the overall surface of the first nitride layer 14. The second nitride layer 16 on the isolation region is then etched. Next, a heat treatment is carried out to form an isolation layer 18, as shown in FIG. 1C. Referring to FIG. 1D, the first and the second nitride layers 14 and 16 and the pad oxide layer 12 are then removed, thereby completing the fabricating process of the isolation layer.

However, the above described NCL process for forming an isolation layer has the following problems. Since the nitride layer is deposited directly on the pad oxide layer, the thickness ratio of the pad oxide layer and the nitride layer must be properly adjusted in order to prevent a stress from being applied to the substrate. This makes the NCL process difficult. If the thickness ratio is not properly adjusted, the stress is applied to the substrate undesirably. Furthermore, if over-etching occurs during the etch process of the pad oxide layer on the active region, a portion of the isolation layer adjacent to the active region could also be etched. This causes slope "a" (shown in FIG. 1D) of the surface of the silicon substrate to abruptly change at the boundary of the active region, and thereby results in the deterioration of TDDB characteristics during the growth of the gate oxide layer.

Another conventional method for fabricating an isolation layer of a semiconductor device using an NSL process (not shown) will now be explained. Similar to the above described NCL process, a pad oxide is first deposited on a silicon substrate. A nitride layer is then formed only on a portion of the pad oxide layer, which will be an active region. This defines an active region and an isolation region. The pad oxide layer in the active region and the silicon substrate of a predetermined thickness are dry and wet etched, in order to reduce the stress applied to the substrate and to deepen the depth of the isolation region. Here, the etched thickness of the substrate varies according to the etch time, and the amount of silicon to be etched varies according to the condition of the etching equipment and/or the space between the isolation regions.

Then, a sidewall spacer formed of nitride is formed on the sides of the pad oxide layer on the active region and the nitride layer. A heat treatment is carried out to form an isolation layer. Next, the nitride layer, the pad oxide layer, and the sidewall spacer are successively removed from the active region, thereby finishing the process.

However, the NSL process has the following problems when it is used to form an isolation layer. Although this method can potentially reduce stress applied to the substrate compared to the NCL process, slope "a" (shown in FIG. 1D) of the silicon substrate surface changes to an angle larger than that in the NCL process. This results in deterioration of TDDB characteristics during the growth of the gate oxide, and generates kink effect in the characteristics of drain current versus gate voltage of MOSFET.

SUMMARY OF THE INVENTION

Accordingly, the present invention is directed to a method for fabricating an isolation layer of a semiconductor device that substantially obviates one or more of the problems due to limitations and disadvantages of the related art.

An object of the present invention is to provide a method for fabricating an isolation layer of a semiconductor device with improved TDDB characteristics of a gate oxide layer and improved kink characteristics of MOSFET while maintaining the same active region width as that in a conventional NCL or NSL process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, a method for fabricating an isolation layer of a semiconductor device according to the present invention includes the steps of defining an active region and an isolation region on a substrate; forming an active pattern having a side wall adjacent to the isolation region on the active region of the substrate; growing a first isolation layer in the isolation region extending to edges of the active region; selectively etching the first isolation layer using the active pattern as a mask; forming a sidewall spacer adjacent to the side wall of active pattern; and growing a second isolation layer in the isolation region.

In another aspect, a method for fabricating an isolation layer of a semiconductor device according to the present invention includes the steps of forming an active pattern which is formed with a first insulating layer, and a first oxidation stop layer formed on the first insulating layer, on an active region of a semiconductor substrate on which active and isolation regions are defined, respectively; growing a first isolation layer through thermal oxidation; selectively etching the first isolation layer using the first oxidation stop layer as a mask; forming a sidewall spacer which is formed with a second insulating layer, and a second oxidation stop layer formed on the second insulating layer, on the sides of the active pattern including a portion of the first isolation layer which is not etched; and growing a second isolation layer through thermal oxidation.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings.

Figure 1A:
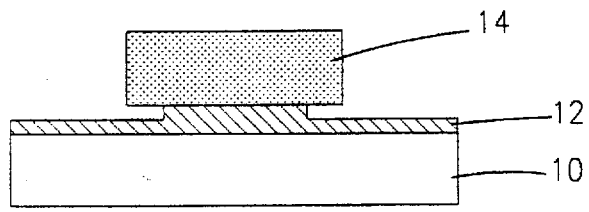
FIGS. 1A to 1D are cross-sectional views showing a method for fabricating an isolation layer of a semiconductor device using a conventional nitride-clad LOCOS process.
Figure 1B:
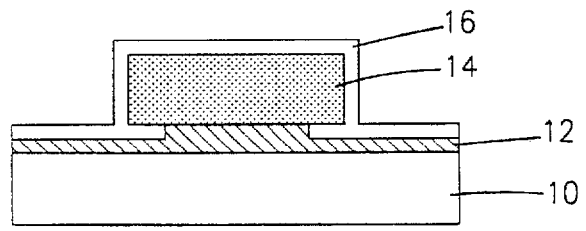
Figure 1C:
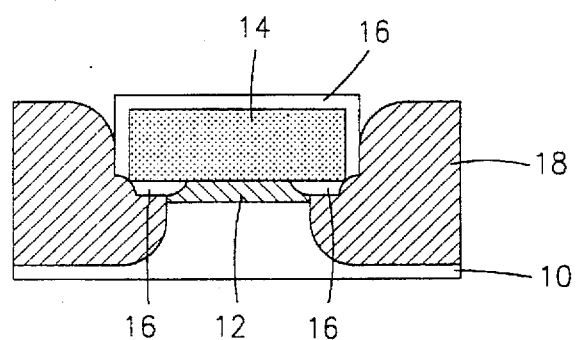
Figure 1D:
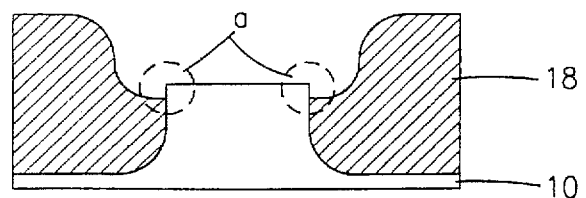
Figure 2A:
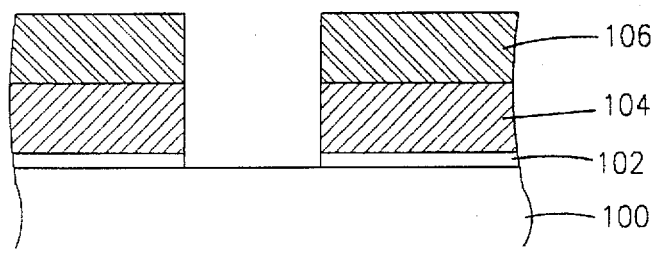
FIGS. 2A to 2F are cross-sectional views showing a method for fabricating an isolation layer of a semiconductor device according to the present invention.

FIGS. 2A to 2F are cross-sectional views showing a method for fabricating an isolation layer of a semiconductor device according to the present invention. As shown in FIG. 2A, a first pad oxide layer 102 (an insulating layer) and a first nitride layer 104 (an oxidation stop layer) are sequentially formed on a silicon substrate 100. A photoresist layer 106 is then coated on the first nitride layer 104. A portion of the photoresist layer 106, where an isolation layer is to be formed, is selectively removed and thus patterned. Then, the first nitride layer 104 and the first pad oxide layer 102 are removed by using the patterned photoresist layer 106 as a mask. This defines an isolation region (where the first pad oxide layer 102 and the first nitride layer 104 are removed) and an active region (where layers 102 and 104 are not removed).

Figure 2B:
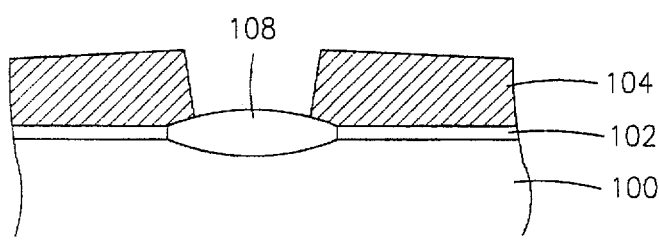
Figure 2C:
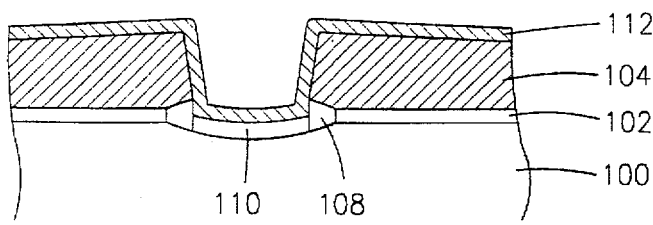

As shown in FIG. 2B, after the photoresist layer 106 is removed, a heat treatment is carried out using the first nitride layer 104 as a mask to grow a first isolation layer 108 having a predetermined thickness. Then, as shown in FIG. 2C, a portion of the first isolation layer 108 (where the surface is exposed) is dry-etched by a thickness of 200 Å to 2000 Å. A second pad oxide layer 110 (an insulating layer) is grown to a thickness of 50 Å to 500 Å on a portion of the silicon substrate where the first isolation layer 108 is removed. Then, a second (CVD) nitride layer 112 (an oxidation stop layer) having a thickness of 50 Å to 1000 Å is formed on the overall surface of the first nitride layer 104, the remaining portion of the first isolation layer 108, and the second pad oxide layer 110.

Figure 2D:
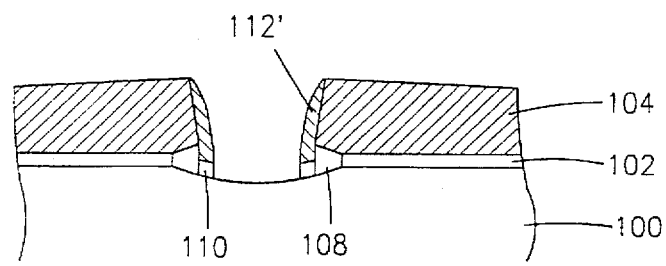
Figure 2E:
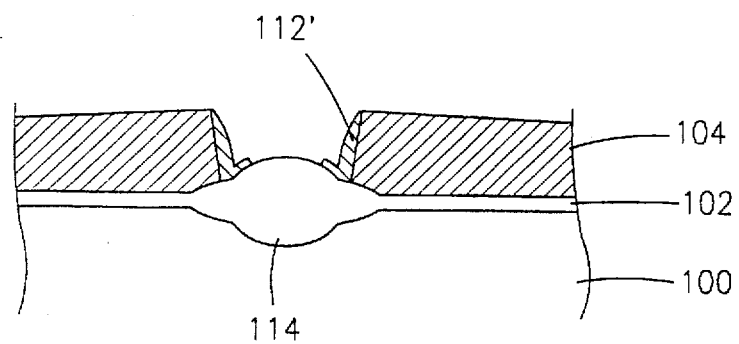
Figure 2F:
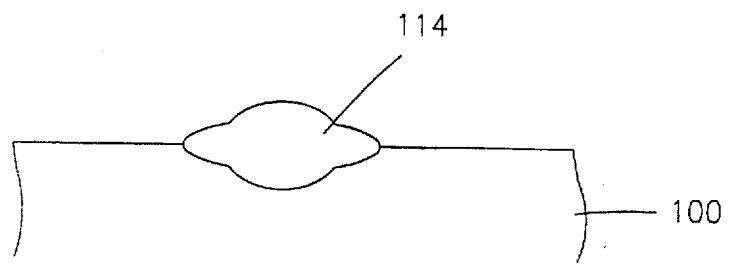

As shown in FIG. 2D, the second (CVD) nitride layer 112 is dry-etched, leaving only the vertical portion of the second nitride layer (112') adjacent to the side wall of the first nitride layer 104. The second pad oxide layer 110 is then etched using the etched second (CVD) nitride layer 112' as a mask, to form a sidewall spacer (which includes the second pad oxide layer 110 and the second nitride layer 112' formed on the second pad oxide layer 110). Then, as shown in FIG. 2E, a second isolation layer 114 is grown to a thickness of 3000 Å to 5000 Å through thermal oxidation. As shown in FIG. 2F, the first and second nitride layers 104 and 112' and the first pad oxide layer 102 are then removed, finishing the process.

Accordingly, the present invention provides a method for fabricating an isolation layer of a semiconductor device, in which TDDB characteristics of a gate oxide layer and kink characteristics of an MOSFET are improved while the same active region width as that in a conventional NCL or NSL process can be obtained through a two step process for growing an isolation layer.

The present invention has the following advantages. First, during the growth of the first isolation layer, a slight "bird's beak" is formed at the boundary of the active region. Hence, stress is not applied to the boundary of the active region during the growth of the second isolation layer. This reduces the junction leakage where the leakage current is generated below the threshold voltage.

Second, the "bird's beak" of the second isolation layer may move to the isolation region through the growth and etching process of the first isolation layer and the formation process of the sidewall spacer. Accordingly, even if a sufficiently thick isolation layer is grown, the same width of the active region can be obtained as that in the conventional NCL or NSL process.

Third, after the first isolation layer is grown, it is dry-etched so that the etched thickness of the silicon substrate can be uniformly controlled regardless of the condition of the etching equipment or the space between the isolation regions.

Fourth, even though the second isolation layer is grown with a large slope around the sidewall spacer by thermal oxidation, it is connected to the "bird's beak" of the first isolation layer (which is not etched) as well as to the "bird's beak" of the second isolation layer. This assures that the second isolation layer and the "bird's beak" of the first and second isolation layers are all used as isolation layer. This prevents time dependent dielectric breakdown (TDDB) characteristics of the gate oxide layer from deteriorating and improves kink characteristics of the MOSFET.

It will be apparent to those skilled in the art that various modifications and variations can be made in the method for fabricating an isolation layer of a semiconductor device of the present invention without departing from the spirit or scope of the invention. Thus, it is intended that the present invention cover the modifications and variations of this invention provided they come within the scope of the appended claims and their equivalents.

What is claimed is:

1. A method for fabricating an isolation layer of a semiconductor device, the method comprising the steps of:

defining an active region and an isolation region on a substrate;

forming an active pattern on the active region of the substrate, the active pattern forming step including forming a first insulating layer over the substrate and a first oxidation stop layer over the first insulating layer;

growing a first isolation layer over the substrate corresponding to the isolation region;

selectively etching the first isolation layer using the first oxidation stop layer as a mask;

forming a sidewall spacer including a second insulating layer and a second oxidation stop layer formed on the second insulating layer, the sidewall spacer being adjacent to the active pattern including a remaining portion of the first isolation layer; and growing a second isolation layer over the substrate.

2. The method as claimed in claim 1, wherein the step of forming the sidewall spacer includes the steps of:

forming the second insulating layer on a portion of the substrate where the first isolation layer is etched;

forming the second oxidation stop layer on an overall surface of the active pattern including the remaining portion of the first isolation layer and the second insulating layer;

etching the second oxidation stop layer; and etching the second insulating layer using the etched second oxidation stop layer as a mask.

3. The method as claimed in claim 2, wherein the step of forming the second insulating layer forms the second insulating layer having a thickness in a range of approximately 50 Å to 500 Å.

4. The method as claimed in claim 2, wherein the step of forming the second oxidation stop layer forms the second oxidation stop layer having a thickness in a range of approximately 50 Å to 500 Å.

5. The method as claimed in claim 1, wherein the steps of forming the first and the second oxidation stop layers each includes forming a nitride layer.

6. The method as claimed in claim 1, wherein the step of selectively etching the first isolation layer etches the first isolating layer by a thickness in a range of approximately 200 Å to 2000 Å.

7. The method as claimed in claim 1, wherein the step of growing the second isolation layer grows the second isolation layer to a thickness in a range of approximately 3000 Å to 5000 Å.

8. A method for fabricating an isolation layer of a semiconductor device, the method comprising the steps of:

defining an active region and an isolation region on a substrate;

forming an active pattern having a sidewall adjacent to the isolation region on the active region of the substrate;

growing a first isolation layer in the isolation region extending to edges of the active region;

selectively etching the first isolation layer using the active pattern as a mask;

forming a sidewall spacer adjacent to the sidewall of the active pattern including a remaining portion of the first isolation layer, wherein the sidewall spacer is formed of a non-oxidative material; and growing a second isolation layer in the isolation region.

9. The method as claimed in claim 8, wherein the first isolation layer is formed through thermal oxidation.

10. The method as claimed in claim 8, wherein the second isolation layer is formed through thermal oxidation.

11. The method as claimed in claim 8, wherein the step of forming the active pattern includes the steps of:

forming an insulating layer on the substrate;

forming an oxidation stop layer on the insulating layer;

etching the insulation layer and the oxidation stop layer over the isolation region to form the sidewall.

12. The method as claimed in claim 11, wherein the step of forming the oxidation stop layers includes forming a nitride layer.

13. The method as claimed in claim 8, wherein the step of forming the sidewall spacer includes the steps of:

forming an oxide layer an a portion of the substrate where the first isolation layer is etched;

forming an oxidation stop layer on an overall surface of the active pattern including a remaining portion of the first isolation layer and the oxide layer;

etching the oxidation stop layer; and etching the oxide layer using the etched oxidation stop layer as a mask.

14. The method as claimed in claim 13, wherein the step of forming the oxide layer forms the oxide layer having a thickness in a range of approximately 50 Å to 500 Å.

15. The method as claimed in claim 13, wherein the step of forming the oxidation stop layer forms the oxidation stop layer having a thickness in a range of approximately 50 Å to 500 Å.

16. The method as claimed in claim 13, wherein the step of forming the oxidation stop layer includes forming a nitride layer.

17. The method as claimed in claim 8, wherein the step of selectively etching the first isolation layer etches the first isolating layer by a thickness in a range of approximately 200 Å to 2000 Å.

18. The method as claimed in claim 8, wherein the step of growing the second isolation layer grows the second isolation layer to a thickness in a range of approximately 3000 Å to 5000 Å.

19. A method for fabricating an isolation layer of a semiconductor device, the method comprising the steps of:

defining an active region and an isolation region on a substrate;

forming an active pattern having a sidewall adjacent to the isolation region on the active region of the substrate, the active pattern forming step including forming a first insulating layer over the substrate and a first oxidation stop layer over the first insulating layer, and selectively etching the first oxidation stop layer and the first insulating layer;

growing a first isolation layer in the isolation region extending to edges of the active region;

selectively etching the first isolation layer using the first oxidation stop layer as a mask;

forming a sidewall spacer adjacent to the sidewall of the active pattern, the sidewall spacer forming step including forming a second insulating layer over the substrate corresponding to an etched portion of the first isolation layer and a second oxidation stop layer over the second insulating layer, and selectively etching the second oxidation stop layer and the second insulating layer; and growing a second isolation layer in the isolation region.

20. The method as claimed in claim 8, wherein the non-oxidative material includes a nitride layer.

* * * * *

UNITED STATES PATENT AND TRADEMARK OFFICE
CERTIFICATE OF CORRECTION

PATENT NO. : 5,747,376
DATED : May 5, 1998
INVENTOR(S) : Lee

It is certified that error appears in the above-identified patent and that said Letters Patent is hereby corrected as shown below:

TITLE PAGE:
Please add Item [30] --Foreign Application Priority Data

Dec. 27, 1995 [KR] Rep. of Korea ....................58732/1995--.

Column 6, line 6, change "an" (second occurence) to --on--.

Signed and Sealed this

Nineteenth Day of January, 1999

Attest:

Attesting Officer

*Acting Commissioner of Patents and Trademarks*